United States Patent
Chang et al.

(10) Patent No.: US 10,249,360 B1
(45) Date of Patent: Apr. 2, 2019

(54) METHOD AND CIRCUIT FOR GENERATING A REFERENCE VOLTAGE IN NEUROMORPHIC SYSTEM

(71) Applicant: National Tsing Hua University, Hsinchu (TW)

(72) Inventors: Meng-Fan Chang, Taichung (TW); Win-San Khwa, Taipei (TW); Jia-Jing Chen, Taoyuan (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 15/827,737

(22) Filed: Nov. 30, 2017

(51) Int. Cl.
| | |
|---|---|
| *G11C 11/4099* | (2006.01) |
| *G06N 3/063* | (2006.01) |
| *G06N 3/10* | (2006.01) |
| *G11C 13/00* | (2006.01) |
| *G11C 11/419* | (2006.01) |
| *G11C 11/54* | (2006.01) |
| *G06N 3/04* | (2006.01) |

(52) U.S. Cl.
CPC .......... *G11C 11/4099* (2013.01); *G06N 3/04* (2013.01); *G06N 3/0635* (2013.01); *G06N 3/10* (2013.01); *G11C 11/419* (2013.01); *G11C 11/54* (2013.01); *G11C 13/0002* (2013.01)

(58) Field of Classification Search
CPC ... G11C 11/4099; G11C 11/419; G11C 11/54; G11C 13/0002; G06N 3/04; G06N 3/0635; G06N 3/10
USPC .......................................................... 706/34
See application file for complete search history.

(56) References Cited

U.S. PATENT DOCUMENTS

| | | | | |
|---|---|---|---|---|
| 9,697,890 | B1* | 7/2017 | Wang | ................... G11C 11/419 |
| 9,842,650 | B2* | 12/2017 | Taniguchi | ............. G11C 11/419 |
| 9,916,875 | B2* | 3/2018 | Liaw | ..................... G11C 11/417 |

* cited by examiner

*Primary Examiner* — Fernando Hidalgo
(74) *Attorney, Agent, or Firm* — Muncy, Geissler, Olds & Lowe, P.C.

(57) ABSTRACT

A method and a circuit for generating a reference voltage are provided. The circuit includes: a first column of dummy neurons with weight 0 and a second column of dummy neurons with weight 1, wherein the plurality word-lines are connected to the dummy neurons in the first and second columns, respectively; a bit-line connected to a voltage source and the first column of dummy neurons; a complementary bit-line is connected to the voltage source and the second column of dummy neurons, wherein when the artificial neural network system is operated to sense the neurons of the memory cell array, one or more of the plurality of word-lines are activated, and the corresponding dummy neurons of the first column and the second column are activated to generate the reference voltage at the output end for sensing the neurons of the memory cell array.

16 Claims, 10 Drawing Sheets

METHOD AND CIRCUIT FOR GENERATING A REFERENCE VOLTAGE IN NEUROMORPHIC SYSTEM

BACKGROUND OF THE INVENTION

Field of the Invention

The exemplary embodiment(s) of the present invention relates to a field of method and circuit for generating sensing reference voltage in neuromorphic applications. More specifically, the exemplary embodiment(s) of the present invention relates to a method and circuit for generating sensing reference voltage utilizing two dummy columns, in that one column of neurons with weight 1 and the other column of neurons with weight 0.

Description of Related Art

In a fully-connected neural network (FCNN), depending on the number of layers, one or more comparisons are performed to check if there is more weight 0's or 1's in a column of a neuron array.

In this case, the ideal sensing reference voltage ($V_{REF}$) for a column of N neurons with M activations should be the resulting voltage from M/2 neurons with 0's and M/2 neurons with 1's. Since the reference voltage $V_{REF}$ is a function of M, which is a variable and unpredictable before the inference operation and causes the challenges.

On the other hand, comparisons for picking the largest candidate out of X candidates are also performed in FCNN. Here, picking the largest candidate out of N candidates usually involves (1) multiple iterations of comparison or (2) converting the analog candidates into the digital counterparts. The approaches mentioned above both incur significant overheads in latency and energy.

Therefore, a new sensing $V_{REF}$ generating scheme that generates a $V_{REF}$ dynamically depending on the number of activations (M), or the simpler approach to pick the largest candidate without multiple sensing iterations or analog-to-digital conversion while achieve energy-saving and time-saving characteristics is needed.

SUMMARY OF THE INVENTION

According to an aspect of the present application, a method for generating a reference voltage is disclosed. The method for generating a reference voltage is adapted for an artificial neural network system connected to a storage device with a memory cell array comprising a plurality of neurons arranged in a matrix and connected to a plurality of word-lines, respectively, the method includes the steps of: arranging a first column of dummy neurons with weight 0 and a second column of dummy neurons with weight 1 with a number corresponding to a number of a row of the memory cell array; connecting the plurality word-lines to the dummy neurons in the first and second columns, respectively; disposing a bit-line connecting to a voltage source and the first column of dummy neurons; disposing a complementary bit-line connecting to the voltage source and the second column of dummy neurons; and connecting the bit-line to the complementary bit-line at an output end of the reference voltage; wherein when the artificial neural network system is operated to sense the neurons of the memory cell array, one or more of the plurality of word-lines are activated, and the corresponding dummy neurons of the first column and the second column are activated to generate the reference voltage at the output end for sensing the neurons of the memory cell array.

Preferably, the first column of dummy neurons with weight 0 and the second column of dummy neurons with weight 1 include a plurality of pre-programmed SRAM cells using decoupled SRAM cells arranged in a column in the SRAM cell array.

Preferably, the first column of dummy neurons with weight 0 and the second column of dummy neurons with weight 1 include a first column of resistive random access memory with low resistance state and a second column of resistive random access memory with high resistance state.

Preferably, the method further includes: connecting a clamping circuit between the voltage source and a common node connected to the bit-line and the complementary bit-line.

Preferably, the method further includes: connecting an adaptive header between the voltage source and a common node connected to the bit-line and the complementary bit-line.

Preferably, the method further includes: providing a pull down circuit at the output end to pull down the reference voltage; or providing a pull up circuit at the output end to pull up the reference voltage.

Preferably, the pull down circuit or the pull up circuit comprises at least one pseudo-SRAM, at least one SRAM, at least one voltage divider or at least one MOSFET.

Preferably, the method further includes: using the pull down circuit to provide at least one dummy neuron with weight 0 at the output end to pull down the reference voltage; or using the pull up circuit to provide at least one dummy neuron with weight 1 at the output end to pull up the reference voltage.

According to another aspect of the present application, a circuit for generating a reference voltage is provided. The circuit for generating a reference voltage is adapted for an artificial neural network system connected to a storage device, with a memory cell array comprising a plurality of neurons arranged in a matrix and connected to a plurality of word-lines, respectively, the circuit includes: a first column of dummy neurons with weight 0 and a second column of dummy neurons with weight 1, wherein the plurality word-lines are connected to the dummy neurons in the first and second columns, respectively; a bit-line connected to a voltage source and the first column of dummy neurons; a complementary bit-line is connected to the voltage source and the second column of dummy neurons, wherein when the artificial neural network system is operated to sense the neurons of the memory cell array, one or more of the plurality of word-lines are activated, and the corresponding dummy neurons of the first column and the second column are activated to generate the reference voltage at the output end for sensing the neurons of the memory cell array.

Preferably, the first column of dummy neurons with weight 0 and the second column of dummy neurons with weight 1 include a plurality of pre-programmed SRAM cells using decoupled SRAM cells arranged in a column in the SRAM cell array.

Preferably, the first column of dummy neurons with weight 0 and the second column of dummy neurons with weight 1 include a first column of resistive random access memory with low resistance state and a second column of resistive random access memory with high resistance state.

Preferably, the circuit further includes a clamping circuit connected between the voltage source and a common node connecting to the bit-line and the complementary bit-line.

Preferably, the first column of dummy neurons with weight 0 and the second column of dummy neurons with weight 1 include a first column of resistive random access memory with low resistance state and a second column of resistive random access memory with high resistance state.

Preferably, the circuit further includes a clamping circuit connected between the voltage source and a common node connecting to the bit-line and the complementary bit-line.

Preferably, the circuit further includes an adaptive header connected between the voltage source and a common node connected to the bit-line and the complementary bit-line.

Preferably, the circuit further includes a pull down circuit connected at the output end to pull down the reference voltage; or a pull up circuit connected at the output end to pull up the reference voltage.

Preferably, the pull down circuit or the pull up circuit includes at least one pseudo-SRAM, at least one SRAM, at least one voltage divider or at least one MOSFET.

Preferably, the pull down circuit is configured to provide at least one dummy neuron with weight 0 at the output end to pull down the reference voltage; or the pull up circuit is configured to provide at least one dummy neuron with weight 1 at the output end to pull up the reference voltage.

With these and other objects, advantages, and features of the invention that may become hereinafter apparent, the nature of the invention may be more clearly understood by reference to the detailed description of the invention, the embodiments and to the several drawings herein.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PREFERRED EMBODIMENTS

Exemplary embodiments of the present invention are described herein in the context of a transpose reading memory device and method.

Those of ordinary skilled in the art will realize that the following detailed description of the exemplary embodiment(s) is illustrative only and is not intended to be in any way limiting. Other embodiments will readily suggest themselves to such skilled persons having the benefit of this disclosure. Reference will now be made in detail to implementations of the exemplary embodiment(s) as illustrated in the accompanying drawings. The same reference indicators will be used throughout the drawings and the following detailed description to refer to the same or like parts.

In accordance with the embodiment(s) of the present invention, the components, process steps, and/or data structures described herein may be implemented using various types of operating systems, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein. Where a method comprising a series of process steps is implemented by a computer or a machine and those process steps can be stored as a series of instructions readable by the machine, they may be stored on a tangible medium such as a computer memory device (e.g., ROM (Read Only Memory), PROM (Programmable Read Only Memory), EEPROM (Electrically Erasable Programmable Read Only Memory), FLASH Memory, Jump Drive, and the like), magnetic storage medium (e.g., tape, magnetic disk drive, and the like), optical storage medium (e.g., CD-ROM, DVD-ROM, paper card and paper tape, and the like) and other known types of program memory.

Figure 1:
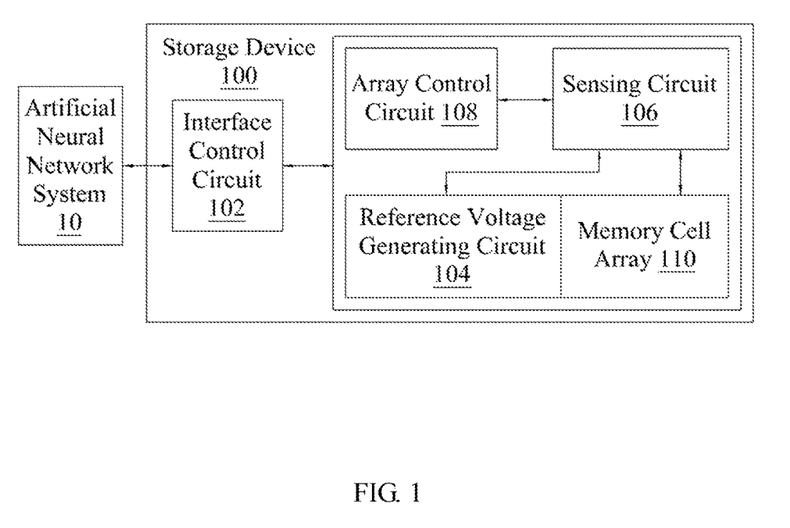
FIG. 1 is a block diagram showing a configuration of a circuit for generating a reference voltage according to the embodiment of the present application.

FIG. 1 is a block diagram showing a configuration of a storage device according to the embodiment of the present application. The storage device 100 is adapted for an artificial neural network system 10 as shown in the figure. The artificial neural network system 10 provides networks which process information by modeling a network of neurons, such as neurons in a human brain, to process information (e.g., stimuli) which has been sensed in a particular environment. Similar to a human brain, neural networks typically comprise multiple neuron models to process information. The demand for improved operating characteristics of neural networks continues to increase. Such desirable neural network operating characteristics improvements are increased speed, capacity and processing power of neural networks, for example. The artificial neural network system 10 may be a fully-connected neural network (FCNN), but not limited thereto.

Before the sensing operation performed in the storage device 100 including a memory cell array 110, a plurality of neurons of the memory cell array 110 are arranged in a matrix and connected to a plurality of word-lines WL. Embodiments disclosed herein are directed to a scheme for generating a reference voltage for the memory device 100, such as the SRAM cells in a commercially available memory device. Neuron weights information indicates the connections or activation of the memory cells via word lines WL and accessing of 0's or 1's stored in the columns of the memory array. When multilevel memory cells are used, the mapping between connections and memory cells can be one-to-one related.

The storage device 100 of FIG. 1 includes an interface control circuit 102, a reference voltage generating circuit 104, a sensing circuit 106, and an array control circuit 108. The interface control circuit 102 and the array control circuit 108 in the storage device 100 provide an interface between the artificial neural network system 10 and the memory cell array 110. The array control circuit 108 controls reading data from or writing data to the memory cell array 110 in cooperation with the sensing circuit 106. The memory cell array 110 may be a SRAM cell array, but not limited thereto. The array control circuit 108 of the storage device 100 receives commands from the interface control circuit 102 and generates the electrical signals to implement reading from and writing to the memory cell array 110. Additionally, the array control circuit 108 may encode, decode and apply error detection and/or correction to the neuron weights information passed between the artificial neural network system 10 and the memory cell array 110. The reference voltage generating circuit 104 is utilized for generating the reference $V_{REF}$ for the sensing circuit 106 to sense or read the data stored in the memory cell array 110. The details of the reference voltage generating circuit 104 will be explained in the following.

Figure 2:
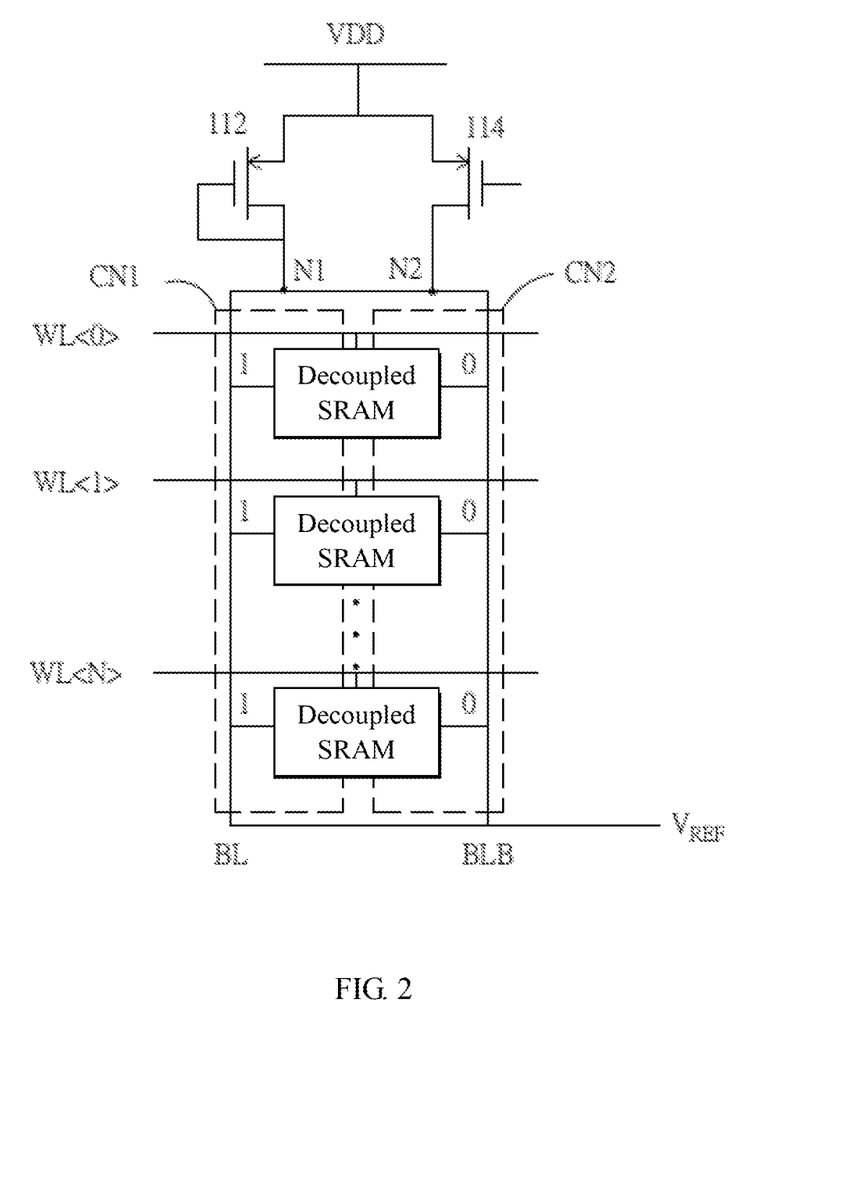
FIG. 2 is a circuit layout of the circuit for generating a reference voltage according to the embodiment of the present application.

Please refer to FIG. 2, which is a circuit layout of the circuit for generating a reference voltage according to the embodiment of the present application. As mentioned above, in the application such as a fully-connected neuronal network, the ideal sensing reference voltage $V_{REF}$ of the memory cell array 110 for a column of N neurons with M activations should be the resulting voltage from M/2 neurons with 0's and M/2 neurons with 1's. In order to generate a reference voltage $V_{REF}$ depending on the number of activations M during the sensing operation, two dummy columns of memory cells are provided as the reference voltage generating circuit 104, which includes a first column CN1 of dummy neurons with weight 1, a second column CN2 of dummy neurons with weight 0, the plurality word-lines WL of the memory cell array 110 are connected to the dummy neurons in the first and second columns, respectively. As shown in FIG. 2, the dummy columns may be implemented with decoupled SRAM cells, in which 1's are stored in the first column CN1 and 0's are stored in the second column CN2. The 1's and 0's in each column are fixed and will not be changed by the access of the neuronal network system 10.

Figure 3:
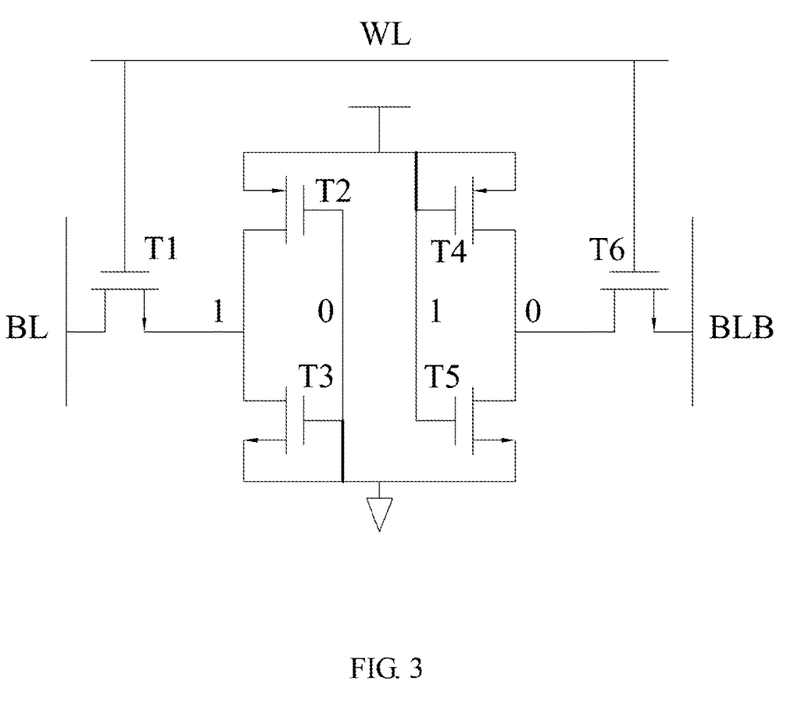
FIG. 3 is an exemplar circuit layout of the decoupled SRAM illustrated in FIG. 2 according to the present application.

Please refer to FIG. 3, which is an exemplar circuit layout of the decoupled SRAM illustrated in FIG. 2 according to the present application. In this example, a six-transistor SRAM (6TSRAM) is utilized. In the 6TSRAM, the gate of the lower-left transistor (T3) is connected to the ground along with the source thereof, such that the voltage level would be kept at the Low state, i.e., storing 0. And, the gate of the upper-right transistor (T4) is connected to the voltage source along with the source thereof, such that the voltage level would be kept at the High state, i.e., storing 1. In the present embodiment, the first column CN1 of dummy neurons with weight 1 and the second column CN2 of dummy neurons with weight 0 are implemented by providing a plurality of pre-programmed SRAM cells using decoupled SRAM cells arranged in a column in the SRAM cell array. In the pre-programmed SRAM cell using the decoupled SRAM cell, the modifications are made to transistors T3 and T4 to provide one neuron with weight 0 and one neuron with weight 1.

Furthermore, the plurality word-lines WL<0>, WL<1>, . . . , WL<N>are connected to the dummy neurons in the first and second columns CN1 and CN2, respectively, such that the dummy neurons may be activated simultaneously as the activated word-lines in the memory cell array 110. In the dummy columns, the bit-line BL is connected to a voltage source VDD and the first column CN1 of dummy neurons, a complementary bit-line BLB is connected to the voltage source VDD and the second column CN2 of dummy neurons. The bit-line BL is further jointed with the complementary bit-line BLB at an output end. After a number M of word-lines to be activated is determined and the word-lines WL are activated by the artificial neural network system 10 according to the neurons of the memory cell array to be sensed, a voltage is output from the output end as the reference voltage $V_{REF}$. During sensing, the activation signal will be the word-lines WL inputs and dynamically generates the reference voltage $V_{REF}$ resulting from having half of the dummy neurons being 0's and the other half being 1's. In operation, the dummy neurons in the first column CN1 and the second column CN2 would be activated corresponding to the word-lines WL input. That is, the activation signals for accessing the memory cell array 110 are also utilized to activate the dummy neurons. Since the two ends of the bit-line BL and the complementary bit-line BLB are coupled together, the reference voltage would be contributed by the activated neurons connected to both the bit-line BL and the complementary bit-line BLB. As shown in FIG. 3, while a specific neuron is activated by the word-line WL, the current would flow in two paths, the first would be from the voltage source to transistors T2 and T3 and then to the ground, the second would be from the voltage source to transistors T4 and T5 and then to the ground. The resistance of the two paths is designed to be substantially the same, and thus each path may have half of the overall current. Consequently, in FIG. 2, at the bit-line BL, the voltage would be half of the neuron of 1's and at the complementary bit-line BLB, the voltage would be half of the neuron of 0's, which leads to the reference voltage $V_{REF}$ having half of the dummy neurons being 0's and the other half being 1's.

Figure 4:
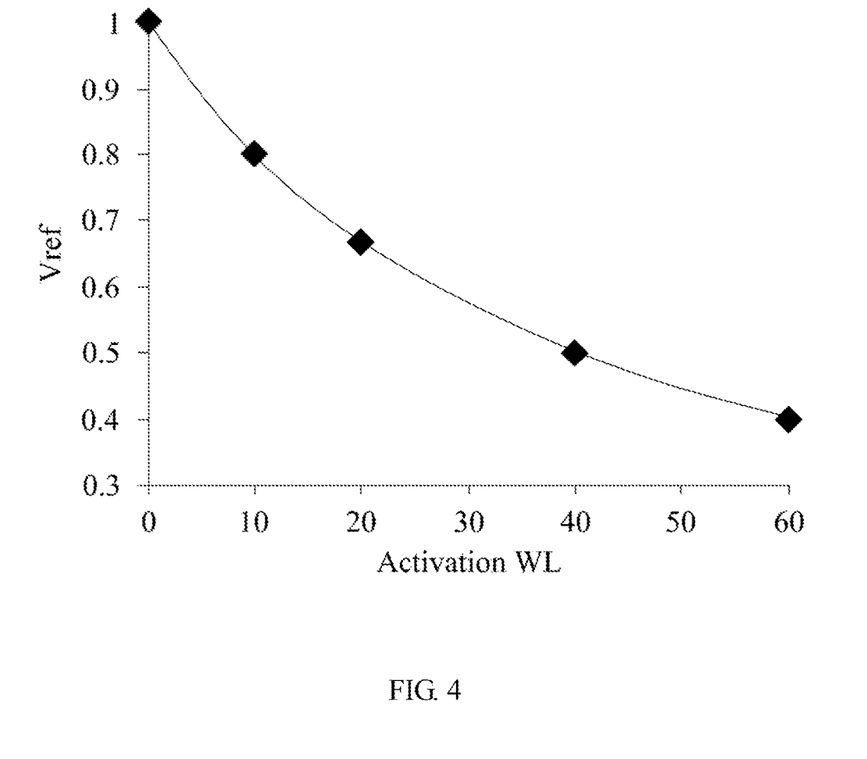
FIG. 4 is a diagram of the reference voltage $V_{REF}$ versus the number of activation word-lines according to the embodiment of the present application.

Referring to FIG. 4, which is a diagram of the reference voltage $V_{REF}$ versus the number of activation word-lines according to the embodiment of the present application. As can be seen in the figure, the generated reference voltage $V_{REF}$ is dynamically adjusted depending on the number of activation word-lines. As illustrated, the more the word lines are activated, the lower the reference voltage $V_{REF}$ will be. For example, when 10 word lines are activated, the reference voltage $V_{REF}$ is at about 0.8V, and when 60 word lines are activated, the reference voltage $V_{REF}$ is at about 0.4V. Such arrangement is very different from the traditional reference voltage that would be a fixed voltage value independent of the number of word lines being activated. In other words, according to the present invention, the reference voltage is $V_{REF}$ a function of the number of activated word lines, which is a voltage level resulting from having half of the dummy neurons being 0's and the other half being 1's.

Alternatively, the first and second columns CN1 and CN2 of dummy neurons of the present application may be implemented by using other memory devices, for example, regular SRAM cells used in the SRAM cell array 110, or two columns of the resistive random access memory (ReRAM) cells, one with low resistance state (LRS) and the other with high resistance state (HRS). Generally, a unit cell of the ReRAM includes a data storage element which has two electrodes and a variable resistive material layer interposed between the two electrodes. The variable resistive material layer, i.e., a data storage material layer, has a reversible variation in resistance according to the polarity and/or magnitude of an electric signal (voltage or current) applied between the electrodes.

Figure 5:
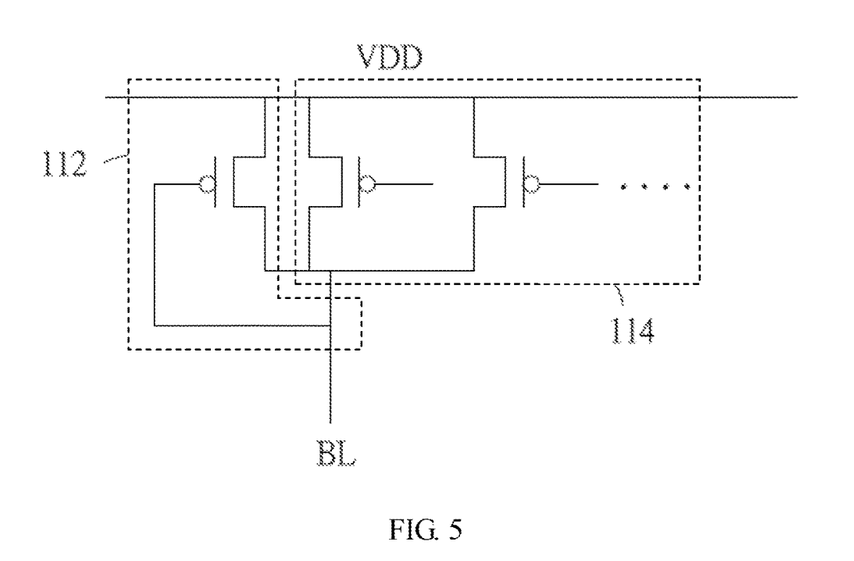
FIG. 5 is an exemplar circuit layout of the clamping circuit and the adaptive header according to the embodiment of the present application.
Figure 6:
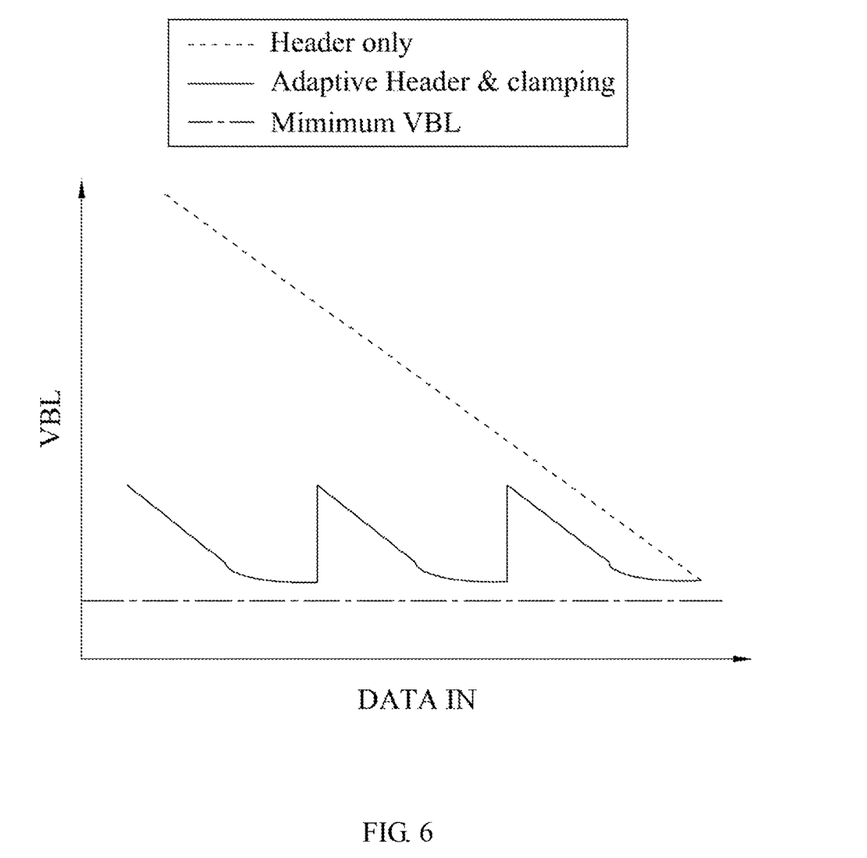
FIG. 6 is a diagram showing the voltage of the bit-lines versus DATA IN in the using of the adaptive header only and the combination of the adaptive header and the clamping circuit according to the embodiment of the present application.

Moreover, when the multiple word-lines WL are turned on in the first or second column CN1 or CN2 of dummy neurons, large cell current will pull down the voltage on the bit-line BL to a lower level and cause destructive read. Therefore, the reference voltage generating circuit 102 further includes a clamping circuit 112 connected between the voltage source VDD and a common node N1 connecting to the bit-line BL and the complementary bit-line BLB, and at least one adaptive header 114 connected between the voltage source VDD and another common node N2 connected to the bit-line BL and the complementary bit-line BLB. Please refer to FIGS. 5 and 6, FIG. 5 is an exemplar circuit layout of the clamping circuit 112 and the adaptive headers 114 according to the embodiment of the present application, FIG. 6 is a diagram showing the voltage of the bit-lines versus DATA IN with the adaptive header only and with the combination of the adaptive header and the clamping circuit according to the embodiment of the present application. While the plurality of word-lines WL are activated, the clamping MOSFET in the clamping circuit 112 may clamp the voltage of the bit-line BL to prevent the destructive read and to suppress the current of the cells, that is, prevent the voltage of the bit line from being pulled below the minimum bit line voltage (minimun VBL). In other embodiments, the adaptive header 114 includes one or more MOSFETs, the transistors of the adaptive header 114 are turned on while the word-lines WL are activated, and the number of turned-on transistors dynamically depends on the number of activation of the word-lines WL. As shown in FIG. 6, as the data input from the word-lines WL, the voltage VBL of the bit-line BL is decreased linearly while maintaining at a voltage level higher than the minimum bit line voltage (beyond the destructive reading) of the bit-line BL in the configuration that the adaptive header 114 is utilized along. In another configuration that the adaptive header 114 and the clamping circuit 112 are provided together, the voltage VBL of the bit-line BL is clamped in a predetermined range while also maintaining at the voltage level higher than the minimum voltage, such that the destructive reading may be prevented accordingly. With the combination of the clamping circuit 112 and the adaptive header 114, the power consumption of the circuit would be reduced since the bit-line voltage VBL is clamped in a predetermined range, in comparison with the much higher bit-line voltage VBL of the configuration with only the header.

Figure 7:
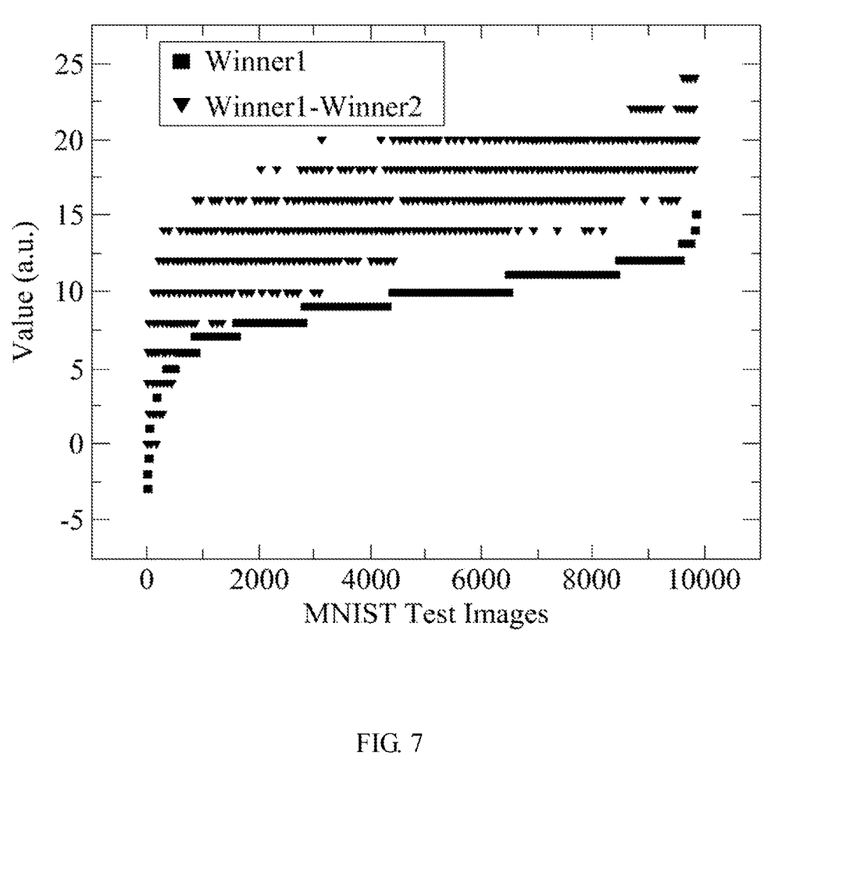
FIG. 7 is a percentage analysis plot of MINIST test image according to the neural network simulation.

As mentioned in the above descriptions, another approach for the neuromorphic application concerns that the goal of the last layer sensing is usually to determine the largest candidate out of X candidates. In order to provide a simpler approach to pick the largest candidate without multiple sensing iterations or analog-to-digital conversion, a neural network simulation has been performed by using MNIST handwritten digit database. Please refer to FIG. 7, which is a percentage analysis plot of MNIST test image according to the neural network simulation. From the neural network simulation using MNIST handwritten digit database, the difference between the winner and the other candidates is usually large. The differences are calculated by the following instructions:

(1) Winner1=the value of the largest candidate.
(2) Winner1-Winner2=the difference between the largest candidate and the second largest candidate.

The percentage of MNIST test images with differences (dots) between the Winner 1 and Winner 2 are shown in the figure, which indicates that the percentage of those Winner 1 less than or equal to Winner 2 is less than 3%. The result implies that approaches concerning multiple sensing iterations and ADC are unnecessary for winner detection for over 97% of the cases.

Figure 8:
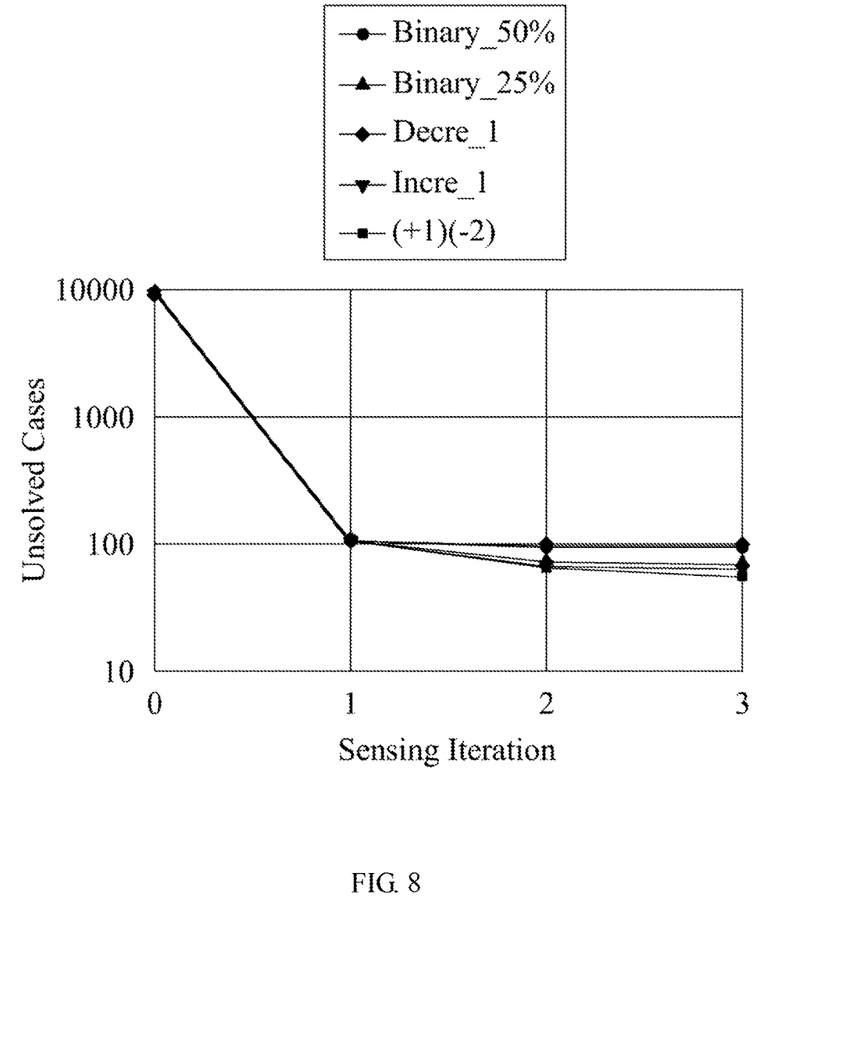
FIG. 8 is an analysis plot illustrates that the relationship between the number of the unsolved cases and the sensing iteration in different second sensing threshold according to the embodiment of the present application.

Further analysis are performed and provided hereinafter. Please refer to FIG. 8, which is an analysis plot illustrates that the relationship between the number of the unsolved cases and the sensing iteration in different second sensing threshold according to the embodiment of the present application. Assuming that the number of activations is represented by N, and the following instructions are provided with reference to FIG. 8:

(I) Binary_50%=next sensing threshold is±50% of the current threshold, depending on sensing results.
(II) Binary_25%=next sensing threshold is±25% of the current threshold, depending on sensing results.
(III) Decre_1=next sensing threshold is the current threshold decreased by 1.
(IV) Incre_1=next sensing threshold is the current threshold increased by 1.
(V) (+1)(−2)=sensing threshold of 2nd iteration is +2

By placing the sensed reference voltage $V_{REF}$ at the reference voltage $V_{REF}$ resulted from N/2+1 neurons with 0's and N/2 neurons with 1's, 98.9% of the test images can be distinguished in one sensing operation. Similarly, 98.2% of the test images could be distinguished in one sensing operation when using the reference voltage $V_{REF}$ resulted from N/2 neurons with 0's and N/2+1 neurons with 1's. In addition, the number of unsolved cases is improved only marginally with increasing sensing iterations regardless of the reference voltage $V_{REF}$ adjustment approaches.

According to the analysis above, the approaches for generating a reference voltage $V_{REF}$ resulted from N/2+1 neurons with 0's and N/2 neurons with 1's, or generating a reference voltage $V_{REF}$ resulted from N/2 neurons with 0's and N/2+1 neurons with 1's may be implemented by pulling down or up the generated reference voltage $V_{REF}$ based on the columns of dummy neurons provided in the previous embodiments.

Figure 9:
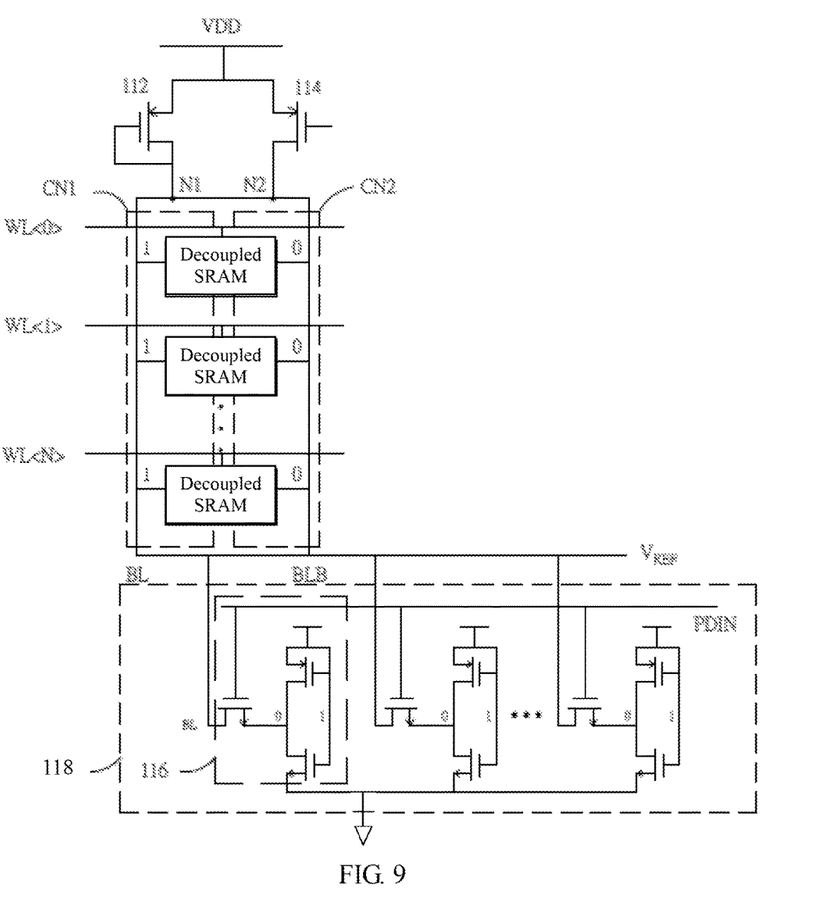
FIG. 9 is a circuit layout of the circuit for generating a reference voltage according to another embodiment of the present application.

Referring to FIG. 9, which is a circuit layout of the circuit for generating a reference voltage according to another embodiment of the present application. The reference voltage generating circuit 104 of the present embodiment further includes a pull down circuit 118 connected at the output end to pull down the reference voltage $V_{REF}$. The pull down circuit 118 may include one or more pseudo-SRAM cell(s) 116 which is similar to the half of the circuit on the right hand side in FIG. 3, and the pseudo-SRAM cell 116 may be provided with same sizing as the dummy neurons in the columns CN1 and CN2, and configured to pull-down the generated $V_{REF}$ while receiving a control signal input from the pull down enable terminal PDIN. The control signal from the pull down enable terminal PDIN may be input from the array control circuit 108 or the sensing circuit 106 provided in the previous embodiments.

In the present embodiment, the pull down circuit 118 is configured to provide at least one dummy neuron with weight 0, as provided in the second column CN2, at the output end to pull down the reference voltage $V_{REF}$. The regular SRAM cells, the voltage dividers, or NMOSFET may also be utilized to pull down $V_{REF}$.

Similarly, a pull up circuit may also be provided at the output end to pull up the reference voltage $V_{REF}$ in another embodiment of the present application, by replacing the pull down circuit 118 of FIG. 9, the pull up circuit may be configured to provide at least one dummy neuron with weight 1, which may be implement with pseudo-SRAM cell(s) similar to the half of the circuit on the left hand side in FIG. 3, as provided in the first column CN1, at the output end to pull up the reference voltage $V_{REF}$. In this case, the pseudo-SRAM cell or PMOSFET may also be utilized to pull up the reference voltage $V_{REF}$. In short, the pull down circuit or the pull up circuit comprises at least one pseudo-SRAM, at least one SRAM, at least one voltage divider or at least one MOSFET Since the simpler approach to pick the largest candidate by using the pull up or pull down circuit is provided, multiple sensing iterations and ADC are unnecessary for winner detection may be omitted for over 97% of the cases during the sensing operation of the neural network system.

In yet another embodiment of the present application, a method for generating a reference voltage is provided by making reference to the drawings. Please refer to FIG. 10, which is a flow chart showing the method for generating a reference voltage according to yet another embodiment of the present application.

Figure 10:
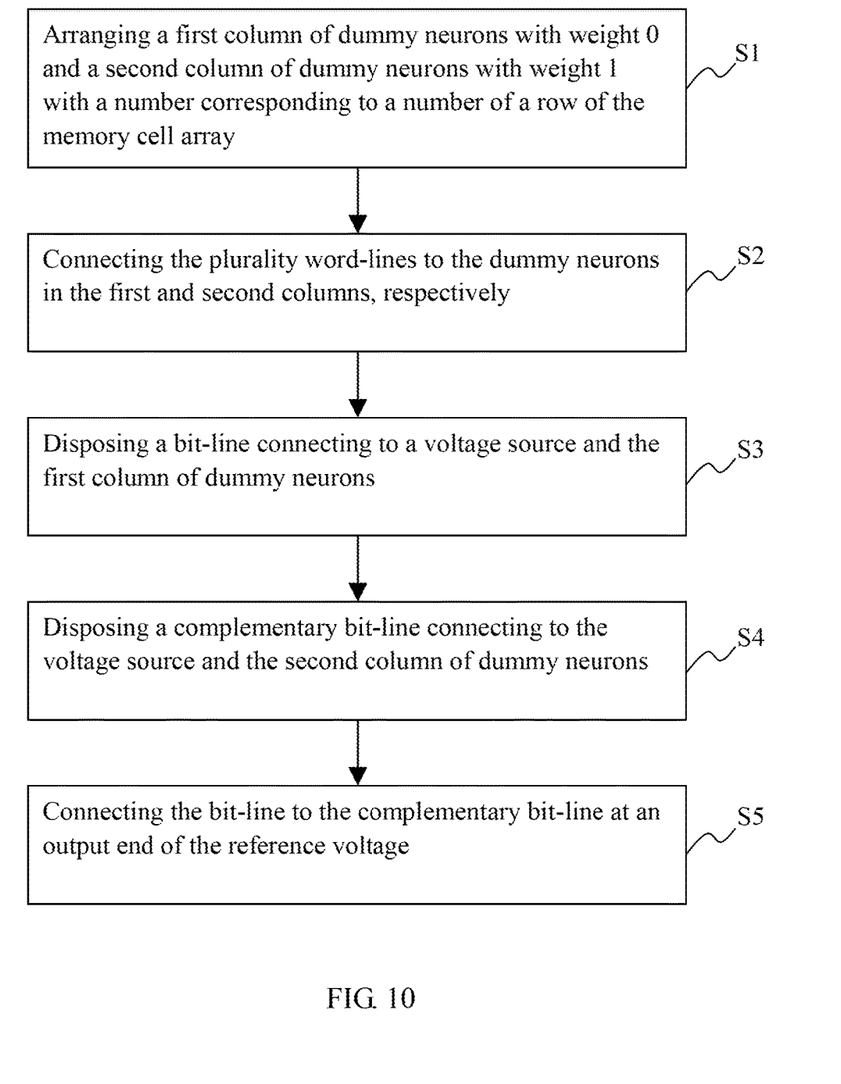
FIG. 10 is a flow chart showing the method for generating a reference voltage according to yet another embodiment of the present application.

The method for generating a reference voltage is adapted for an artificial neural network system 10 connected to a storage device 100, as mentioned in the previous embodiments. Therefore, the repeated descriptions are omitted for clarity. The method includes the steps of:

Step S1: arranging a first column of dummy neurons with weight 0 and a second column of dummy neurons with weight 1 with a number corresponding to a number of a row of the memory cell array;

Step S2: connecting the plurality word-lines to the dummy neurons in the first and second columns, respectively;

Step S3: disposing a bit-line connecting to a voltage source and the first column of dummy neurons;

Step S4: disposing a complementary bit-line connecting to the voltage source and the second column of dummy neurons;

Step S5: connecting the bit-line to the complementary bit-line at an output end of the reference voltage.

When the artificial neural network system is operated to sense the neurons of the memory cell array, one or more of the plurality of word-lines are activated, and the corresponding dummy neurons of the first column and the second column are activated to generate the reference voltage at the output end for sensing the neurons of the memory cell array.

Alternatively, in step 5, the pull down or the pull up operations described in the previous embodiments may be performed by using the pull down circuit to provide at least one dummy neuron with weight 0 at the output end to pull down the reference voltage, or using the pull up circuit to provide at least one dummy neuron with weight 1 at the output end to pull up the reference voltage. The pull down circuit or the pull up circuit comprises at least one pseudo-SRAM, at least one SRAM, at least one voltage divider or at least one MOSFET. The other aspects of the method are similar to the aforementioned embodiments as described in FIGS. 1-8, and detailed explanation of the method is omitted for conciseness.

From above, the method and circuit for generating the reference voltage of the present application provides an efficient way to provide a new sensing $V_{REF}$ generating scheme that generates a $V_{REF}$ dynamically depending on the number of activations (M), and further provides the simpler approach to pick the largest candidate without multiple sensing iterations or analog-to-digital conversion while achieve energy-saving and time-saving characteristics.

In another configuration of the present application, the adaptive header and the clamping circuit are provided together, such that the voltage of the bit-line is clamped in a predetermined range while maintaining at the voltage level higher than the minimum voltage, thus the destructive reading may be prevented accordingly.

While particular embodiments of the present invention have been shown and described, it will be obvious to those skilled in the art that, based upon the teachings herein, changes and modifications may be made without departing from this invention and its broader aspects. Therefore, the appended claims are intended to encompass within their scope of all such changes and modifications as are within the true spirit and scope of the exemplary embodiment(s) of the present invention.

What is claimed is:

1. A method for generating a reference voltage adapted for an artificial neural network system connected to a storage device with a memory cell array comprising a plurality of neurons arranged in a matrix and connected to a plurality of word-lines, respectively, the method comprising the steps of:
   arranging a first column of dummy neurons with weight 0 and a second column of dummy neurons with weight 1 with a number corresponding to a number of a row of the memory cell array;
   connecting the plurality word-lines to the dummy neurons in the first and second columns, respectively;
   disposing a bit-line connecting to a clamping circuit and the first column of dummy neurons;
   disposing a complementary bit-line connecting to an adaptive header and the second column of dummy neurons;
   connecting the clamping circuit and the adaptive header to a voltage source; and
   connecting the bit-line to the complementary bit-line at an output end of the reference voltage;
   wherein when the artificial neural network system is operated to sense the neurons of the memory cell array, one or more of the plurality of word-lines are activated, and the corresponding dummy neurons of the first column and the second column are activated to generate the reference voltage at the output end for sensing the neurons of the memory cell array.

2. The method of claim 1, wherein the first column of dummy neurons with weight 0 and the second column of dummy neurons with weight 1 comprise a plurality of pre-programmed SRAM cells using decoupled SRAM cells arranged in a column in the SRAM cell array.

3. The method of claim 1, wherein the first column of dummy neurons with weight 0 and the second column of dummy neurons with weight 1 respectively comprise a first column of resistive random access memory with low resistance state and a second column of resistive random access memory with high resistance state.

4. The method of claim 1, further comprising:
   connecting the clamping circuit between the voltage source and a common node connected to the bit-line and the complementary bit-line.

5. The method of claim 1, further comprising:
   connecting the adaptive header between the voltage source and a common node connected to the bit-line and the complementary bit-line.

6. The method of claim 1, further comprising:
providing a pull down circuit at the output end to pull down the reference voltage; or
providing a pull up circuit at the output end to pull up the reference voltage.

7. The method of claim 6, wherein the pull down circuit or the pull up circuit comprises at least one pseudo-SRAM, at least one SRAM, at least one voltage divider or at least one MOSFET.

8. The method of claim 6, further comprising:
using the pull down circuit to provide at least one dummy neuron with weight 0 at the output end to pull down the reference voltage; or
using the pull up circuit to provide at least one dummy neuron with weight 1 at the output end to pull up the reference voltage.

9. A circuit for generating a reference voltage adapted for an artificial neural network system connected to a storage device, with a memory cell array comprising a plurality of neurons arranged in a matrix and connected to a plurality of word-lines, respectively, the circuit comprising:
a first column of dummy neurons with weight 0 and a second column of dummy neurons with weight 1, the plurality word-lines connecting to the dummy neurons in the first and second columns, respectively;
a bit-line connected to a clamping circuit and the first column of dummy neurons;
a complementary bit-line connected to an adaptive header and the second column of dummy neurons, the bit-line being connected to the complementary bit-line at an output end; and
a voltage source connected to the clamping circuit and the adaptive header,
wherein when the artificial neural network system is operated to sense the neurons of the memory cell array, one or more of the plurality of word-lines are activated, and the corresponding dummy neurons of the first column and the second column are activated to generate the reference voltage at the output end for sensing the neurons of the memory cell array.

10. The method of claim 9, wherein the first column of dummy neurons with weight 0 and the second column of dummy neurons with weight 1 includes a plurality of pre-programmed SRAM cells using decoupled SRAM cells arranged in a column in the SRAM cell array.

11. The circuit of claim 9, wherein the first column of dummy neurons with weight 0 and the second column of dummy neurons with weight 1 respectively include a first column of resistive random access memory with low resistance state and a second column of resistive random access memory with high resistance state.

12. The circuit of claim 9, wherein
the clamping circuit is connected between the voltage source and a common node connecting to the bit-line and the complementary bit-line.

13. The circuit of claim 9, wherein
the adaptive header is connected between the voltage source and a common node connected to the bit-line and the complementary bit-line.

14. The circuit of claim 9, further comprising:
a pull down circuit connected at the output end to pull down the reference voltage; or
a pull up circuit connected at the output end to pull up the reference voltage.

15. The circuit of claim 14, wherein the pull down circuit or the pull up circuit comprises at least one pseudo-SRAM, at least one SRAM, at least one voltage divider or at least one MOSFET.

16. The circuit of claim 14, wherein the pull down circuit is configured to provide at least one dummy neuron with weight 0 at the output end to pull down the reference voltage; or
wherein the pull up circuit is configured to provide at least one dummy neuron with weight 1 at the output end to pull up the reference voltage.

* * * * *